United States Patent [19]

Thornton

[11] Patent Number: 4,849,704
[45] Date of Patent: Jul. 18, 1989

[54] DUTY CYCLE INDEPENDENT PHASE DETECTOR

[75] Inventor: Roger D. Thornton, St. Marys, Ohio

[73] Assignee: Westinghouse Electric Corp., Pittsburgh, Pa.

[21] Appl. No.: 38,687

[22] Filed: Apr. 15, 1987

[51] Int. Cl.[4] .................. H03K 5/13; H03K 9/06; H03D 3/24
[52] U.S. Cl. .................. 328/133; 328/155; 375/120; 307/262
[58] Field of Search .............. 328/133, 134, 155; 307/262; 375/119, 120; 331/47, 57

[56] References Cited

U.S. PATENT DOCUMENTS

| | | | |
|---|---|---|---|
| 4,371,974 | 2/1983 | Dugan | 375/120 |
| 4,422,176 | 12/1983 | Summers | 328/133 |
| 4,574,243 | 3/1986 | Levine | 307/262 |
| 4,635,280 | 1/1987 | Smith et al. | 375/120 |
| 4,688,094 | 8/1987 | Tanabe et al. | 328/155 |

Primary Examiner—Stanley D. Miller
Assistant Examiner—B. P. Davis
Attorney, Agent, or Firm—C. L. McHale

[57] ABSTRACT

A phase detecting circuit for use in phase-locked loops is provided with a pair of bistable circuits such as type D flip-flops. One of the circuits is clocked by a reference input signal and reset by the Q output of the other circuit. The other circuit is clocked by a second data signal and reset by the NOT Q output of the first circuit. The average value of the voltage appearing on the NOT Q output of the first circuit is proportional to the phase difference between the reference data signal and the second data signal.

9 Claims, 3 Drawing Sheets

DUTY CYCLE INDEPENDENT PHASE DETECTOR

BACKGROUND OF THE INVENTION

This invention relates to electronic phase detector circuits and more particularly to phase detector circuits suitable for use in phase-locked loops.

Phase-locked loop oscillators have many applications wherein a local oscillator must be synchronized to a received signal. Typically, a phase-locked loop includes a phase detecting device, a voltage controlled oscillator and a feed-back circuit. The phase detecting device receives a reference data signal while simultaneously receiving a feed-back data signal. In response thereto, the phase detecting device generates phase detection signals having an average amplitude indicating the difference in phase between two data signals. The voltage controlled oscillator is coupled to receive the phase detection signal. In response thereto, the voltage controlled oscillator generates output signals having a frequency proportional to the magnitude of the phase detection signal. The output of the voltage controlled oscillator is used to form the feed-back data signal through a feed-back circuit.

Phase-locked loops are utilized, for example, to generate a control signal in synchronism with a reference signal. Synchronization between the control and reference signals is largely dependent upon the operational characteristics of the phase detector. This is because the phase detector controls the voltage controlled oscillator which changes its output frequency in response to the phase detection signal to correct errors indicated by the phase detection signal.

In the control circuitry of a solid state inverter or the like, it is often necessary to sense electrical waveforms in one circuit and then generate a control signal which accurately reflects the desired phase angle with respect to a reference signal. For example, in a variable speed constant frequency (VSCF) aircraft power system, it becomes necessary to force the output of the VSCF inverter into synchronism with an external power source. This permits momentary paralleling of the VSCF system with external power for a non-interrupted power transfer. It is necessary to control the error between the VSCF output waveform and the external supply to small values. Any error will result in unbalanced real power flow. For lightly loaded conditions, this could mean that negative power would flow out of the VSCF inverter and positive power would flow out of the external supply during paralleled operation. If such a condition exists, even for as long as a tenth of a second, then the VSCF DC link voltage may rise to unacceptable levels. Therefore, an accurate and relatively fast phase-locked loop is required.

U.S. Pat. No. 4,520,319, issued May 28, 1985 to Baker illustrates a phase detector which is suitable for use in a phase-locked loop of a control circuit of a VSCF power system. A second type of phase detector which may be used in the control circuitry of a VSCF power system is illustrated in the phase-locked loop Item No. 60 of FIG. 4 of a co-pending commonly assigned application Ser. No. 938,652, filed Dec. 5, 1986 by M. A. Beg D. E. Baker and entitled "Master Clock System for a Parallel Variable Speed Constant Frequency Power System", now U.S. Pat. No. 4,707,142, issued Nov. 17, 1987.

These phase detectors meet the basic VSCF phase locked loop requirements that: phase-lock occurs when phase error between the input and output is zero degrees; at phase-lock output ripple voltage is zero, with deviations from zero phase error causing increasingly higher ripple until maximum ripple occurs at plus or minus 180°; and only one stable point (zero output) exists over a 360° span, thereby eliminating the possibility of phase lock at the wrong angle. Since ripple voltage is very nearly zero, no additional filtering is needed between the phase detector and the integrator of the phase-locked loop to reduce frequency modulation.

Although both of those phase detector circuits perform their intended function in a satisfactory manner, they possess certain characteristics which limit their utility. For example, the phase detector illustrated in Pat. No. 4,520,319 requires that the input frequency signal has a 50% duty cycle. This requirement may be difficult to meet if the frequency source is a zero crossing detector on an external power source. In that case, a complex debounce circuit may be required to maintain the 50% duty cycle and still accurately sense the input frequency. Although the phase detector circuit illustrated in Pat. No. 4,704,142 is less duty cycle dependent in that it does not rely on the falling edge of the input signals, it still requires that both signals be at a logic low state simultaneously. Also, since it utilizes AC coupled logic, it is susceptible to electromagnetic interference. It is therefore desirable to develope a phase detector circuit which does not utilize AC (capacitor) coupled logic and is not limited to input signals having a 50% duty cycle.

SUMMARY OF THE INVENTION

The present invention seeks to provide an electronic phase detector which is relatively immune from electromagnetic interference and functions independently of the duty cycle of the input waveform. Such a circuit provides a simplified and improved phase-locked loop and, by relaxing its requirements, the input frequency source can also be simplified.

The phase detecting circuit constructed in accordance with this invention includes a pair of bi-stable circuit elements each having a data input, a clock input, and a reset input. The data inputs of these circuits are each connected to a logic signal having a predetermined logic state, for example, a logic high signal. A first one of these circuits includes a NOT Q output which goes to a logic low state when a logic high signal is received at its clock input and its reset input is receiving a logic low signal. This NOT Q output also goes to a logic high state when a logic high signal is received at the circuit's reset input. The second circuit includes a Q output which goes to a logic high state when a logic high signal is received at that circuit's clock input and that circuit's reset input is receiving a low signal. The Q output goes to a logic low state when a logic high signal is received at that circuit's reset input. The NOT Q output of the first circuit is connected to the reset input of the second circuit. The Q output of the second circuit is connected to the reset input of the first circuit. Means are provided for connecting a reference data signal to the clock input of the first circuit and for connecting a second data signal to the clock input of the second circuit. These circuits function such that the average value of the voltage appearing on the NOT Q output of the first bi-stable circuit is proportional to the phase difference between the reference data signal and the second data signal.

The phase detector circuit of this invention is particularly applicable for use in a phase-locked loop circuit which includes the above-described phase detector and further includes an inverter having an input for receiving the second data signal and having an output connected to the clock input of the second bi-stable circuit. A voltage dividing circuit is connected between the NOT Q output of the first bi-stable circuit and the input of the inverter. In this case, the average value of the voltage appearing at an intermediate point in the voltage dividing circuit is proportional to the phase difference between the reference data signal and the second data signal. Means is provided for shifting the magnitude of the average voltage by fixed amount. An integrator integrates the shifted magnitude average voltage to obtain a frequency control signal and a voltage controlled oscillator generates the second data signal in response to this frequency control signal.

It will be apparent from the following description that the phase detector circuit of the present invention operates independently of the duty cycle of the reference data signal and does not incorporate AC coupled logic.

DESCRIPTION OF THE PREFERRED EMBODIMENT

Figure 1:
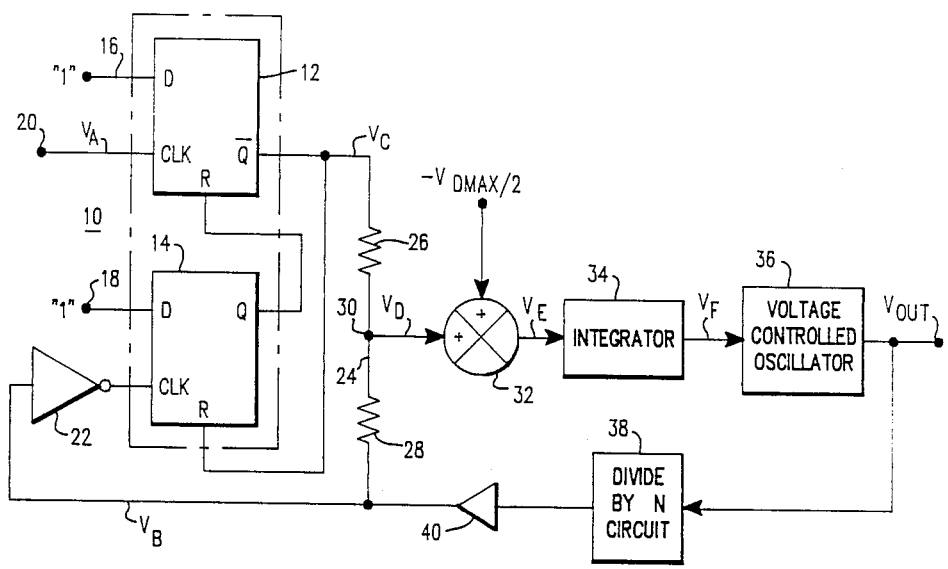
FIG. 1 is a schematic diagram of a phase-locked loop which includes a phase detector constructed in accordance with one embodiment of this invention.

Referring to the drawings, FIG. 1 is a schematic diagram of a phase-locked loop containing a phase detection circuit constructed in accordance with one embodiment of the present invention. The phase detection circuit 10 comprises a pair of bi-stable circuits, as represented by type D flip-flops 12 and 14, wherein each bi-stable circuit includes a data input D, a clock input CLK, and a reset input R. Flip-flop 12 has a NOT Q output which is electrically connected to the reset input of flip-flop 14. Flip-flop 14 has a Q output which is electrically connected to the reset input of flip-flop 12. The data inputs of flip-flops 12 and 14 are connected to terminals 16 and 18 respectively which receive a logic signal having a predetermined logic state that is illustrated to be a logic 1 in this embodiment. The clock input of flip-flop 12 is connected to a terminal 20 for receiving a reference data input signal $V_A$. An inverter 22 includes an input for receiving a second data signal $V_B$ and an output which is connected to the clock input of flip-flop 14.

In operation, a voltage signal $V_C$ appears at the NOT Q output of flip-flop 12 and has an average value which is proportional to the phase difference between the reference data signal $V_A$ and the second data signal $V_B$. A voltage dividing circuit branch 24 which includes the series connection of resistors 26 and 28 is connected between the NOT Q output of flip-flop 12 and the input of inverter 22. This voltage divider produces a voltage $V_D$ at the junction point 30 between the resistors that is added to a bias voltage $-V_{DMAX/2}$ in summation point 32 to produce a control voltage $V_E$. This control voltage is integrated by integrator 34 to produce a frequency control signal $V_F$. A voltage controlled oscillator 36 responds to the frequency control signal $V_F$ and produces an output voltage signal $V_{OUT}$. A feedback loop comprising a divide by N circuit 38 and a buffer 40 transforms the output voltage signal $V_{OUT}$ into the second data signal $V_B$.

Figure 2:
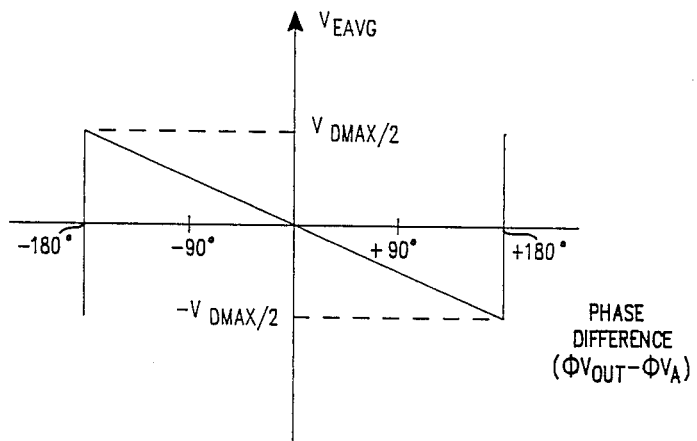
FIG. 2 is a graph which illustrates the output of the phase detector of FIG. 1.

FIG. 2 is a plot of the average phase detection error signal $V_{EAVG}$ with respect to the phase difference between the input reference signal $V_A$ and the output voltage signal $V_{OUT}$. The average phase error detection signal $V_{EAVG}$ varies linearly from a phase difference of $-180°$ to $=180°$, thereby having a single zero output stable condition over the 360° control range.

Figure 3:
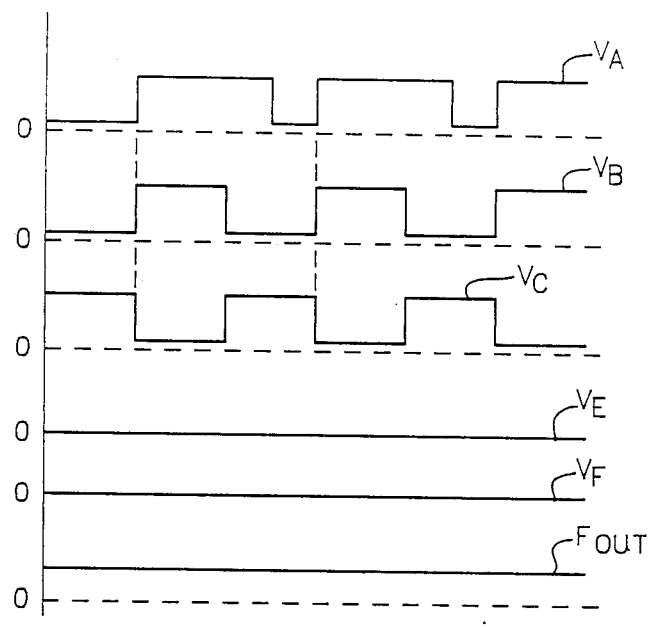
FIGS. 3, 4, 5 and 6 are a series of waveforms which illustrate the operation of the circuit of FIG. 1.

FIG. 3 is a series of waveforms which illustrate the operation of the circuit of FIG. 1 under steady state phase-locked conditions. Under these conditions, the second data signal $V_B$ and the NOT Q output of flip-flop 12 $V_C$ are seen to be 180° out-of-phase such that the phase detection error signal $V_E$ remains at zero and the output of the integrator $V_F$ is also zero. The output frequency $F_{OUT}$ of the voltage controlled oscillator 36 then remains constant at the VCO center frequency.

Figure 4:
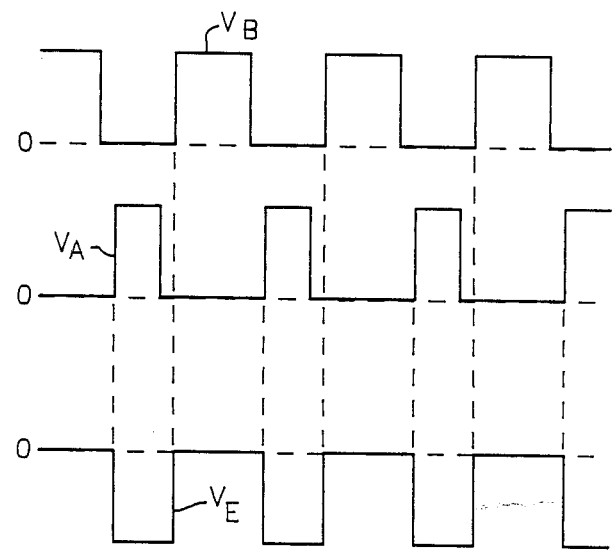
Figure 5:
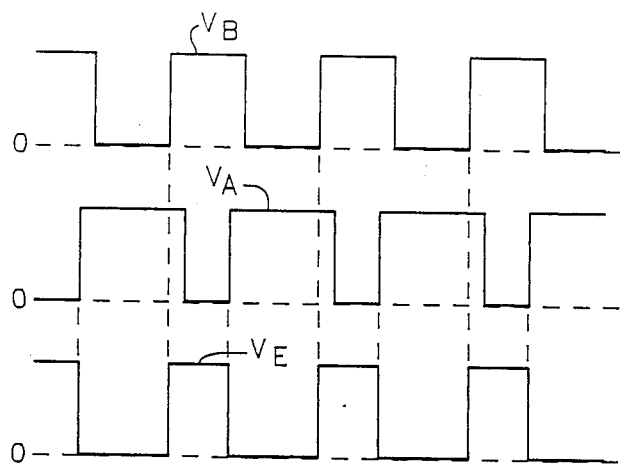
Figure 6:
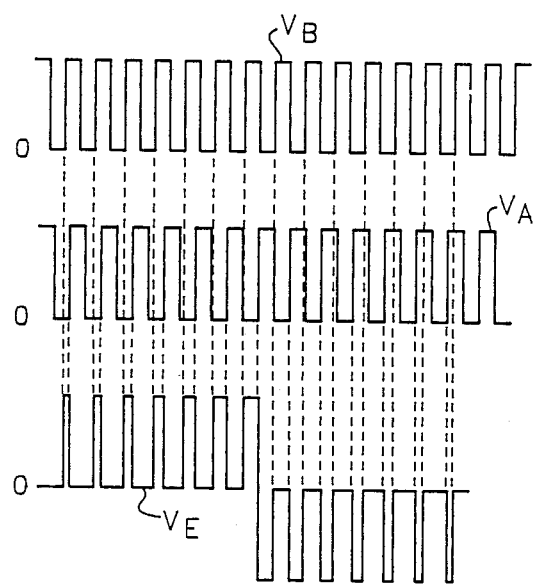

The waveforms of FIGS. 4, 5 and 6 illustrate the operation of the circuit of FIG. 1 over the 360° error range. The waveforms of FIG. 4 are representative of the circuit voltage signals when $V_A$ leading $V_B$ and the duty cycle of $V_A$ is less than 50%. The waveforms of FIG. 5 represent circuit operation when $V_B$ is leading $V_A$ and the duty cycle of $V_A$ is greater than 50%. FIG. 6 illustrates how the phase detection error signal $V_E$ is affected as the phase difference between signals $V_A$ and $V_B$ is swept across a 360° range.

It should now be apparent that the phase-locked loop of FIG. 1 includes a phase detector which operates independently of the duty cycle of the input reference signal $V_A$. This circuit possesses all of the features of existing phase detectors for use in VSCF phase-locked loops and has the additional advantage of input frequency duty cycle independence. This independence is achieved by using the falling edge of the feedback signal to dictate the sign of the phase error signal. The feedback signal requires a 50% duty cycle to obtain the sign information. However, this requirement is less stringent than the need for both the input signal and the feedback signal to be precisely 50% duty cycle square waves. Generally, the output frequency of the VCO has a 50% duty cycle and a divide by N feedback circuit element will meet the duty cycle requirements for all N greater than one.

It should be noted that the lowest "zero error" ripple produced by the circuit of FIG. 1 occurs when the divide-by-N 38 output source impedance and voltage swing match the characteristics of the type D flip-flop NOT Q output. Any small voltage or resistance unbalances can be adjusted out at the summing junction 32. The same logic family with the same output characteristics would typically be used in applications of this invention. However, in the event that this is not true, a buffer 40 may be required in the feedback loop to maintain good ripple characteristics.

While the present invention has been described in terms of what is at present believed to be its preferred embodiment, it will be apparent to those skilled in the art that various changes and modifications may be made to the preferred embodiment without departing from the scope of the invention. It is therefore intended that the appended claims cover such changes and modifications.

What is claimed is:

1. A phase detecting circuit comprising:
   a first bistable circuit having a data input, a clock input, a reset input and a NOT Q output, wherein said first fistable circuit data input is connected to a predetermined logic signal and wherein said NOT Q output goes to a logic low state when a logic high signal is received at said first circuit clock input and said first circuit reset input is receiving a logic low signal, and said NOT Q output goes to a logic high state when a logic high signal is received at said first circuit reset input;
   a second bistable circuit having a data input, a clock input, a reset input, and a Q output, wherein said second circuit data input is connected to said predetermined logic signal and wherein said Q output goes to a logic high state when a logic high signal is received at said second circuit clock input and said second circuit reset input is receiving a logic low signal, and said Q output goes to a logic low state when a logic high signal is received at said second circuit reset input;
   said NOT Q output of said first bistable circuit being connected to said reset input of said second bistable circuit;
   said Q output of said second bistable circuit being connected to said reset input of said first bistable circuit;
   means for connecting the data inputs of said first and second bistable circuits to a logic signal having a predetermined logic state;
   means for connecting a reference data signal to the clock input of said first bistable circuit;
   means for connecting a second data signal to the clock input of said second bistable circuit;
   wherein the average value of the voltage appearing on the NOT Q output of said first bistable circuit is proportional to the phase difference between the reference data signal and the second data signal.

2. A phase detecting circuit as recited in claim 1, wherein said average value varies linearly from a first predetermined voltage level to a second predetermined voltage level as the phase difference between said reference signal and said controlled data signal varies from $-180°$ to $+180°$.

3. A phase detecting circuit as recited in claim 1, wherein said means for connecting the second data signal to the clock input of the second bistable circuit, comprises:
   an inverter having an input for receiving said second data signal and having an output connected to the clock input of said second bistable circuit.

4. A phase detecting circuit as recited in claim 3, further comprising:
   a voltage dividing circuit branch connected between the NOT Q output of said first bistable circuit and the input of said inverter.

5. A phase detecting circuit as recited in claim 4, wherein said voltage dividing circuit branch comprises:
   a pair of resistors electrically connected in series, wherein the average voltage appearing at the junction of said resistors is proportional to the phase difference between said reference data signal and said second data signal.

6. A phase detecting circuit as recited in claim 1, wherein said first and second bistable circuits are type D flip-flop circuits.

7. A phase-locked loop circuit comprising:
   a first bistable circuit having a data input, a clock input, a reset input and a NOT Q output, wherein said first circuit data input is connected to a predetermined logic signal and wherein said NOT Q output goes to a logic low state when a logic high signal is received at said first circuit clock input and said first circuit reset input is receiving a logic low signal, and said NOT Q output goes to a logic high state when a logic high signal is received at said first circuit reset input;
   a second bistable circuit having a data input, a clock input, a reset input, and a Q output, wherein said second circuit data input is connected to said predetermined logic signal and wherein said Q output goes to a logic high state when a logic high signal is received at said second circuit clock input and said second circuit reset input is receiving a logic low signal, and said Q output goes to a logic low state when a logic high signal is received at said second circuit reset input;
   said NOT Q output of said first bistable circuit being connected to said reset input of said second bistable circuit;
   said Q output of said second bistable circuit being connected to said reset input of said first bistable circuit;
   means for connecting a reference data signal to the clock input of said first bistable circuit;
   an inverter having an input for receiving a second data signal and having an output connected to the clock input of said second bistable circuit;
   a voltage dividing circuit branch connected between the NOT Q output of said first bistable circuit and the input of said inverter;
   wherein the average value of the voltage appearing at an intermediate point in said voltage dividing circuit is proportional to the phase difference between the reference data signal and the second data signal;
   means for shifting the magnitude of said average voltage by a fixed amount;
   means for integrating the shifted magnitude average voltage to obtain a frequency control signal; and
   means for generating said second data signal in response to said frequency control signal 8. A phase-locked loop circuit as recited in claim 7, wherein said voltage divider circuit branch comprises:
   a pair of resistors electrically connected in series, and wherein said intermediate point is the common connection of said resistors.

9. A phase-locked loop circuit as recited in claim 7, wherein said means for shifting the magnitude of said average voltage comprises:
   a summing means which adds a fixed voltage to said average voltage.

* * * * *